United States Patent
Agarwal et al.

(10) Patent No.: US 11,479,857 B2
(45) Date of Patent: Oct. 25, 2022

(54) CLEAN ISOLATION VALVE FOR REDUCED DEAD VOLUME

(71) Applicant: Applied Materials, Inc., Santa Clara, CA (US)

(72) Inventors: Ashutosh Agarwal, San Jose, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 11 days.

(21) Appl. No.: 17/025,294

(22) Filed: Sep. 18, 2020

(65) Prior Publication Data

US 2021/0087685 A1   Mar. 25, 2021

Related U.S. Application Data (60) Provisional application No. 63/022,466, filed on May 9, 2020, provisional application No. 62/902,912, filed on Sep. 19, 2019.

(51) Int. Cl.
   *C23C 16/40*    (2006.01)
   *C23C 16/455*   (2006.01)
   *H01J 37/32*    (2006.01)

(52) U.S. Cl.
   CPC .. *C23C 16/45544* (2013.01); *C23C 16/45565* (2013.01); *H01J 37/3244* (2013.01); *H01J 37/32357* (2013.01)

(58) Field of Classification Search
   CPC ........ C23C 16/45544; C23C 16/45565; C23C 16/45561; H01J 37/3244; H01J 37/32357
   USPC .............. 118/715, 723 ME, 723 ER, 723 IR; 156/345.33, 345.34, 345.35, 345.36
   See application file for complete search history.

(56) References Cited

U.S. PATENT DOCUMENTS

| | | | | |
|---|---|---|---|---|
| 5,307,568 | A | * | 5/1994 | Matsuo ............. H01J 37/32871 34/92 |
| 5,362,328 | A | * | 11/1994 | Gardiner ............. C23C 16/4483 134/115 R |
| 5,620,524 | A | * | 4/1997 | Fan ..................... C23C 16/4481 417/415 |
| 5,730,174 | A | * | 3/1998 | Mismas ............. F15B 13/0835 137/271 |
| 5,819,782 | A | * | 10/1998 | Itafuji ................... F15B 13/086 137/271 |
| 5,879,458 | A | * | 3/1999 | Roberson, Jr. .... H01L 21/67769 414/217 |

(Continued)

FOREIGN PATENT DOCUMENTS

| CN | 202144891 U | 2/2012 |
|---|---|---|
| WO | 2018202949 A1 | 11/2018 |

OTHER PUBLICATIONS

PCT International Search Report and Written Opinion in PCT/US2020/051514 dated Jan. 6, 2021, 11 pages.

*Primary Examiner* — Rudy Zervigon
(74) *Attorney, Agent, or Firm* — Servilla Whitney LLC (57) ABSTRACT

Gas distribution apparatus, processing chambers and methods using a dead volume-free valve are described. The valve has a first inlet line with upstream and downstream ends and a second inlet line with a downstream end that connects to the first inlet line. A sealing surface at the downstream end of the second inlet line separates the first inlet line from the second inlet line preventing fluid communication between the first inlet line and the second inlet line.

17 Claims, 6 Drawing Sheets

(56) References Cited

U.S. PATENT DOCUMENTS

| | | | | |
|---|---|---|---|---|
| 5,983,933 | A * | 11/1999 | Ohmi | F15B 13/0896 137/613 |
| 5,988,217 | A * | 11/1999 | Ohmi | F16K 27/003 137/496 |
| 6,116,283 | A * | 9/2000 | Yamaji | G05D 7/0635 137/271 |
| 6,374,861 | B1 * | 4/2002 | Johnson | F16K 27/003 137/884 |
| 6,543,483 | B2 * | 4/2003 | Johnson | F16K 27/003 137/884 |
| 7,017,609 | B2 * | 3/2006 | Miwa | F16K 27/003 137/884 |
| 7,418,978 | B2 * | 9/2008 | Chao | C07F 9/12 137/884 |
| 7,699,023 | B2 * | 4/2010 | Chen | C23C 16/34 118/723 VE |
| 7,780,785 | B2 * | 8/2010 | Chen | C23C 16/45525 156/345.33 |
| 7,780,789 | B2 * | 8/2010 | Wu | C23C 16/34 156/345.33 |
| 7,816,200 | B2 * | 10/2010 | Kher | H01L 21/823857 257/E21.267 |
| 7,896,030 | B2 * | 3/2011 | Shinohara | F16K 27/003 137/884 |
| 7,985,350 | B2 * | 7/2011 | Teff | C07C 7/20 44/445 |
| 8,216,374 | B2 * | 7/2012 | Huston | F16L 41/03 156/345.33 |
| 8,973,615 | B2 * | 3/2015 | Hoshi | F16K 27/003 248/225.11 |
| 9,269,567 | B2 * | 2/2016 | Hsueh | C23C 16/45548 |
| 9,574,268 | B1 * | 2/2017 | Dunn | C23C 16/45512 |
| 10,370,761 | B2 * | 8/2019 | Dunn | C23C 16/45512 |
| 10,636,626 | B2 * | 4/2020 | Pandey | C23C 16/45502 |
| 10,662,527 | B2 * | 5/2020 | Marquardt | H01L 21/0262 |
| 2001/0020488 | A1 * | 9/2001 | Ishii | F16K 27/003 137/271 |
| 2002/0038671 | A1 * | 4/2002 | Johnson | F16K 27/003 137/884 |
| 2002/0060360 | A1 * | 5/2002 | Sugiyama | C23C 16/4409 438/115 |
| 2002/0073925 | A1 * | 6/2002 | Noble | C23C 16/452 118/723 ME |
| 2003/0121608 | A1 * | 7/2003 | Chen | C23C 16/34 257/E21.171 |
| 2003/0213560 | A1 * | 11/2003 | Wang | H01L 21/67196 156/345.31 |
| 2004/0173151 | A1 * | 9/2004 | Miwa | F17D 1/04 118/715 |
| 2007/0215209 | A1 * | 9/2007 | Street | F17C 5/06 137/263 |
| 2007/0295414 | A1 * | 12/2007 | Shinohara | F16K 27/003 137/561 A |
| 2008/0102203 | A1 * | 5/2008 | Wu | C23C 16/45502 118/728 |
| 2008/0102208 | A1 * | 5/2008 | Wu | C23C 16/45502 118/728 |
| 2008/0107809 | A1 * | 5/2008 | Wu | H01L 21/76871 427/248.1 |
| 2008/0271796 | A1 * | 11/2008 | Neumann | F17C 5/06 137/606 |
| 2009/0017227 | A1 | 1/2009 | Fu | |
| 2009/0263961 | A1 * | 10/2009 | Kher | C23C 16/45582 257/E21.159 |
| 2011/0065276 | A1 * | 3/2011 | Ganguly | H01L 21/67207 257/E21.257 |
| 2012/0000606 | A1 | 1/2012 | Dorai et al. | |
| 2015/0170908 | A1 * | 6/2015 | Hsueh | C23C 16/45561 438/758 |
| 2017/0009348 | A1 | 1/2017 | Chandrasekharan et al. | |
| 2017/0350011 | A1 * | 12/2017 | Marquardt | H01L 21/0262 |
| 2019/0131167 | A1 | 5/2019 | Rice et al. | |
| 2020/0248308 | A1 * | 8/2020 | Marquardt | C23C 16/45561 |
| 2021/0087685 | A1 * | 3/2021 | Agarwal | H01J 37/3244 |
| 2021/0118668 | A1 * | 4/2021 | Nandwana | C23C 16/45544 |
| 2021/0395892 | A1 * | 12/2021 | Mustafa | C23C 16/45536 |

* cited by examiner

CLEAN ISOLATION VALVE FOR REDUCED DEAD VOLUME

CROSS-REFERENCE TO RELATED APPLICATIONS

This application claims priority to U.S. Provisional Application No. 63/022,466, filed May 9, 2020, and U.S. Provisional Application No. 62/902,912, filed Sep. 19, 2019, the entire disclosures of which are hereby incorporated by reference herein.

TECHNICAL FIELD

Embodiments of the disclosure generally relate to isolation valves. In particular, embodiment of disclosure relate to isolation valves for semiconductor manufacturing with reduced dead volumes.

BACKGROUND

Gas flow paths including various valves are common in the semiconductor manufacturing industry. Current flow path configurations have dead volumes that require a purge to prevent process gas back flow in the clean gas manifold. This is especially important where reactive gases are employed to prevent gas phase reactions in the gas lines. The reaction products can damage the equipment by chemical reaction or causing clogging.

Additionally, the residue left from gas phase reactions in the process lines can have a substantial negative effect on subsequent processes. The residue may react with subsequent gases or process conditions creating undesired products. The residue can also enter the process space and form particulates on the substrate, damaging the device being manufactured. The manufacturing equipment needs to be subjected to extensive maintenance to remove and replace clogged lines and valves leading to significant downtime and a loss of throughput.

Accordingly, there is a need for apparatus and methods to minimize dead volume and/or prevent back flow in semiconductor manufacturing.

SUMMARY

One or more embodiments of the disclosure are directed to gas distribution apparatus comprising a valve with a first inlet line and a second inlet line. The first inlet line has an upstream end and a downstream end defining a length of the first inlet line. The second inlet line has an upstream end and a downstream end defining a length of the second inlet line. The downstream end of the inlet line connects with the first inlet line along the length of the first inlet line. A sealing surface is at the downstream end of the second inlet line. The sealing surface is configured to separate the first inlet line and the second inlet line to prevent fluid communication between the first inlet line and the second inlet line.

Additional embodiments of the disclosure are directed to processing chambers comprising a gas distribution apparatus with a valve with a first inlet line and a second inlet line. The first inlet line has an upstream end and a downstream end defining a length of the first inlet line. The second inlet line has an upstream end and a downstream end defining a length of the second inlet line. The downstream end of the inlet line connects with the first inlet line along the length of the first inlet line. A sealing surface is at the downstream end of the second inlet line. The sealing surface is configured to separate the first inlet line and the second inlet line to prevent fluid communication between the first inlet line and the second inlet line. A gas distribution plate is in fluid communication with the second end of the first inlet line. The gas distribution plate has a front surface with a plurality of apertures therethrough to allow a flow of gas to pass through the gas distribution plate. A spacer is around the gas distribution plate. The spacer is within an opening in a top of the processing chamber. A substrate support is inside the processing chamber and has a support surface spaced a distance from the front surface of the gas distribution plate.

Further embodiments of the disclosure are directed to processing methods comprising: flowing a first gas through a first inlet line of a dead volume-free valve into a processing chamber. The dead volume-free valve comprises the first inlet line and a second inlet line. The first inlet line has an upstream end and a downstream end defining a length of the first inlet line. The second inlet line has an upstream end and a downstream end defining a length of the second inlet line. The downstream end of the inlet line connects with the first inlet line along the length of the first inlet line. A sealing surface is at the downstream end of the second inlet line. The sealing surface is configured to separate the first inlet line and the second inlet line to prevent fluid communication between the first inlet line and the second inlet line. A second gas is flowed through the second inlet line of the dead volume-free valve into the processing chamber. The first gas does not flow into the second inlet line. Switching between the first gas and second gas does not include a purge step to clear the valve of residual gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Figure 1:
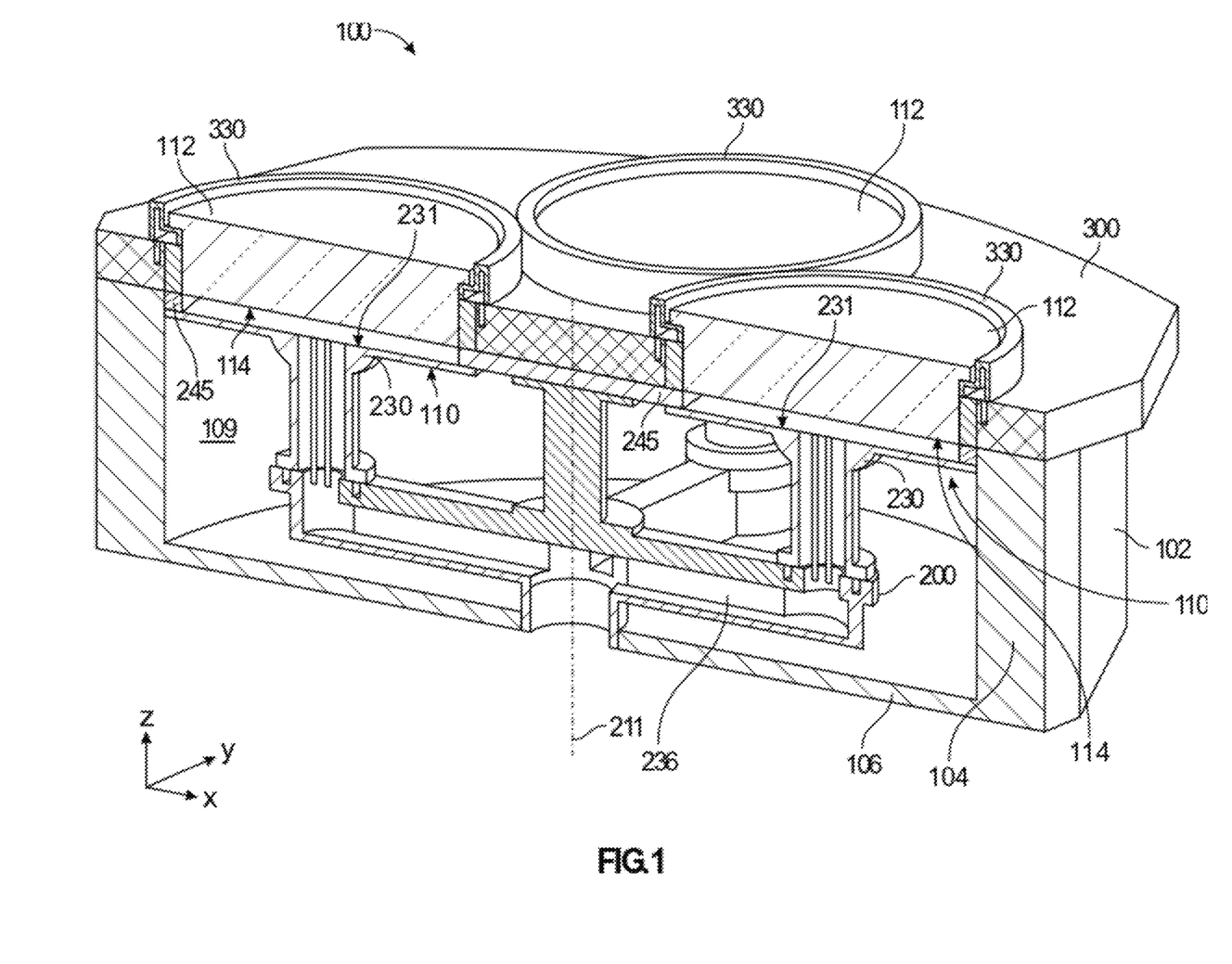
FIG. 1 shows a cross-sectional isometric view of a processing chamber in accordance with one or more embodiment of the disclosure.
Figure 2:
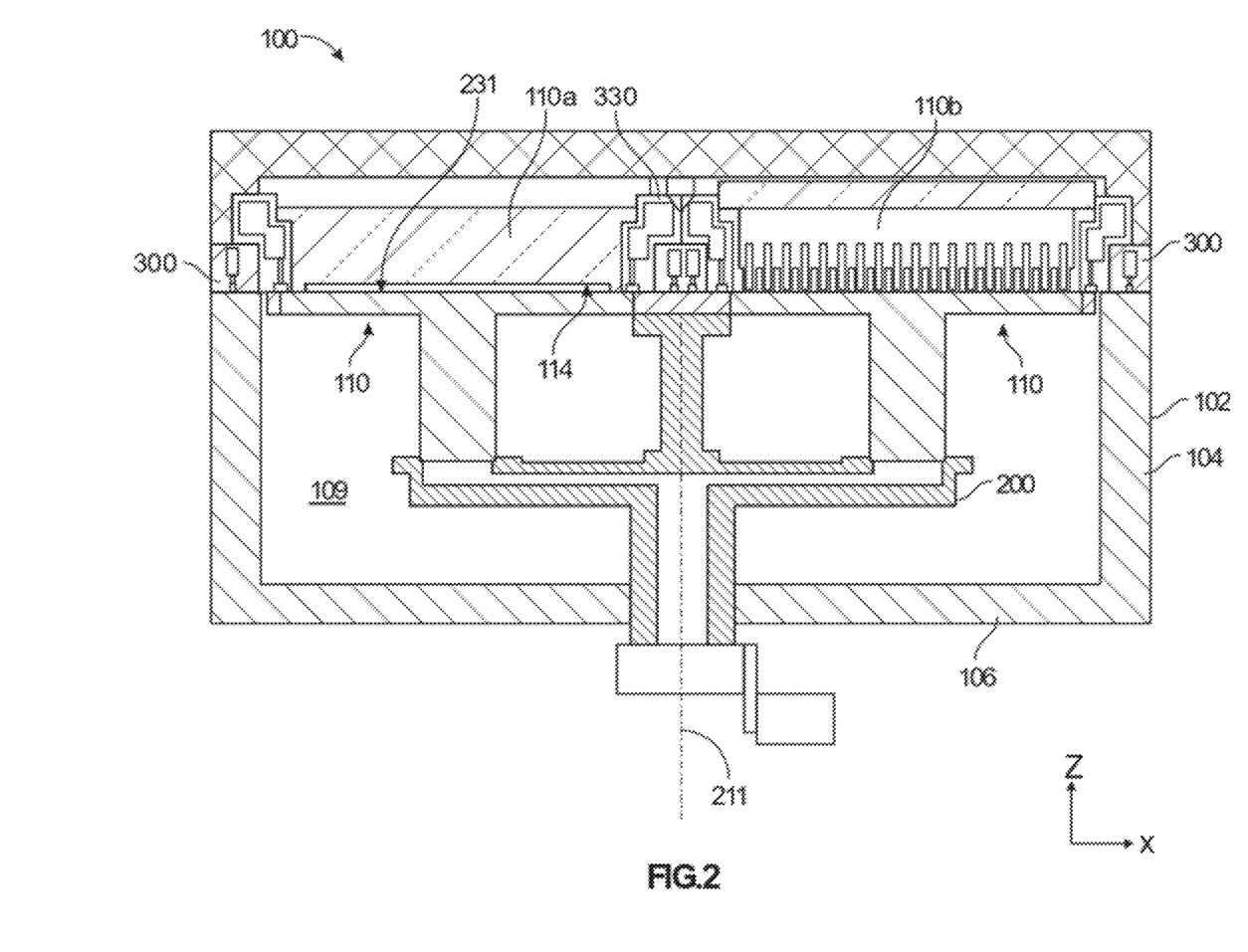
FIG. 2 shows a cross-sectional view of a processing chamber in accordance with one or more embodiment of the disclosure.

The disclosure provides substrate supports for use with single wafer or multi-wafer (also referred to as batch) process chambers. FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a substrate support 200.

The processing chamber 100 has a housing 102 with walls 104 and a bottom 106. The housing 102 along with the top plate 300 define a interior volume 109, also referred to as a processing volume.

The processing chamber 100 illustrated includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas distribution plates 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas distribution plate 112. In the illustrated embodiment, heaters 230 act as the substrate support surfaces and form part of the substrate support 200.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
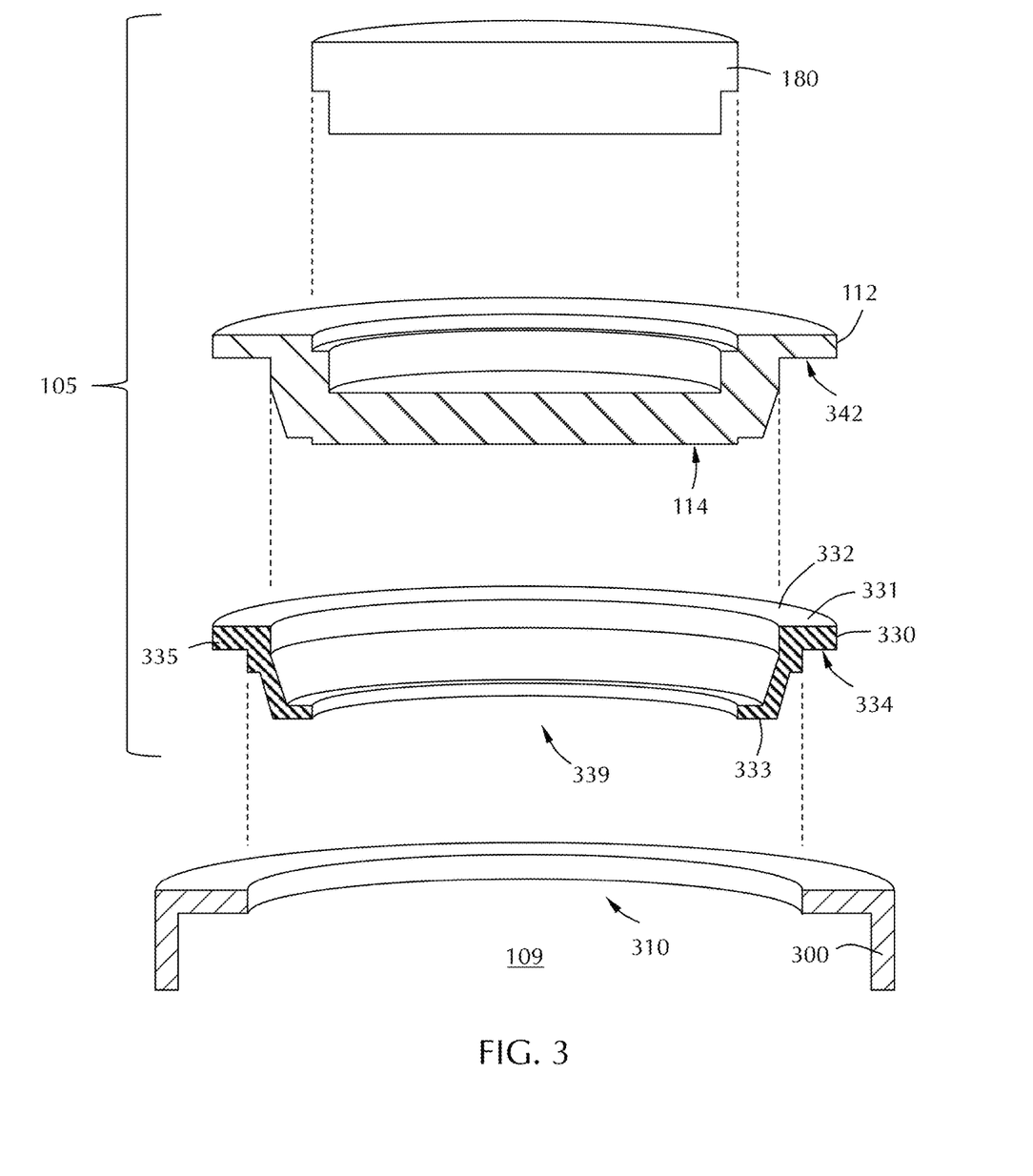
FIG. 3 is an exploded cross-sectional view of a processing station in accordance with one or more embodiment of the disclosure.

FIG. 3 illustrates an exploded view of a gas distribution assembly 105 for use in a processing station 110 or a process chamber in accordance with one or more embodiment of the disclosure. The skilled artisan will recognize that embodiment illustrated in FIG. 3 is a general schematic and omits details (e.g., gas channels). The gas distribution assembly 105 illustrated comprises three main components: a gas distribution plate 112, a lid 180 and an optional spacer 330. The spacer 330 is also referred to as a pump/purge spacer, insert or pump/purge insert. In some embodiments, the spacer 330 is connected to or in fluid communication with a vacuum (exhaust). In some embodiments, the spacer 330 is connected to or in fluid communication with a purge gas source.

The openings 310 in the top plate 300 can be uniformly sized or have different sizes. Different sized/shape gas distribution plates 112 can be used with a pump/purge spacer 330 that is suitably shaped to transition from the opening 310 to the gas distribution plate 112. For example, as illustrated, the pump/purge spacer 330 includes a top 331 and bottom 333 with a sidewall 335. When inserted into the opening 310 in the top plate 300, a ledge 334 is configured to be positioned in the opening 310.

The pump/purge spacer 330 includes an opening 339 in which a gas distribution plate 112 can be inserted. The gas distribution plate 112 illustrated has a flange 342 which can be in contact with the ledge formed by the back surface 332 adjacent the top 331 of the pump/purge spacer 330. The diameter or width of the gas distribution plate 112 can be any suitable size that can fit within the opening 339 of the pump/purge spacer 330. This allows gas distribution plates 112 (also referred to as gas injectors) of various types to be used within the same opening 310 in the top plate 300.

Figure 4:
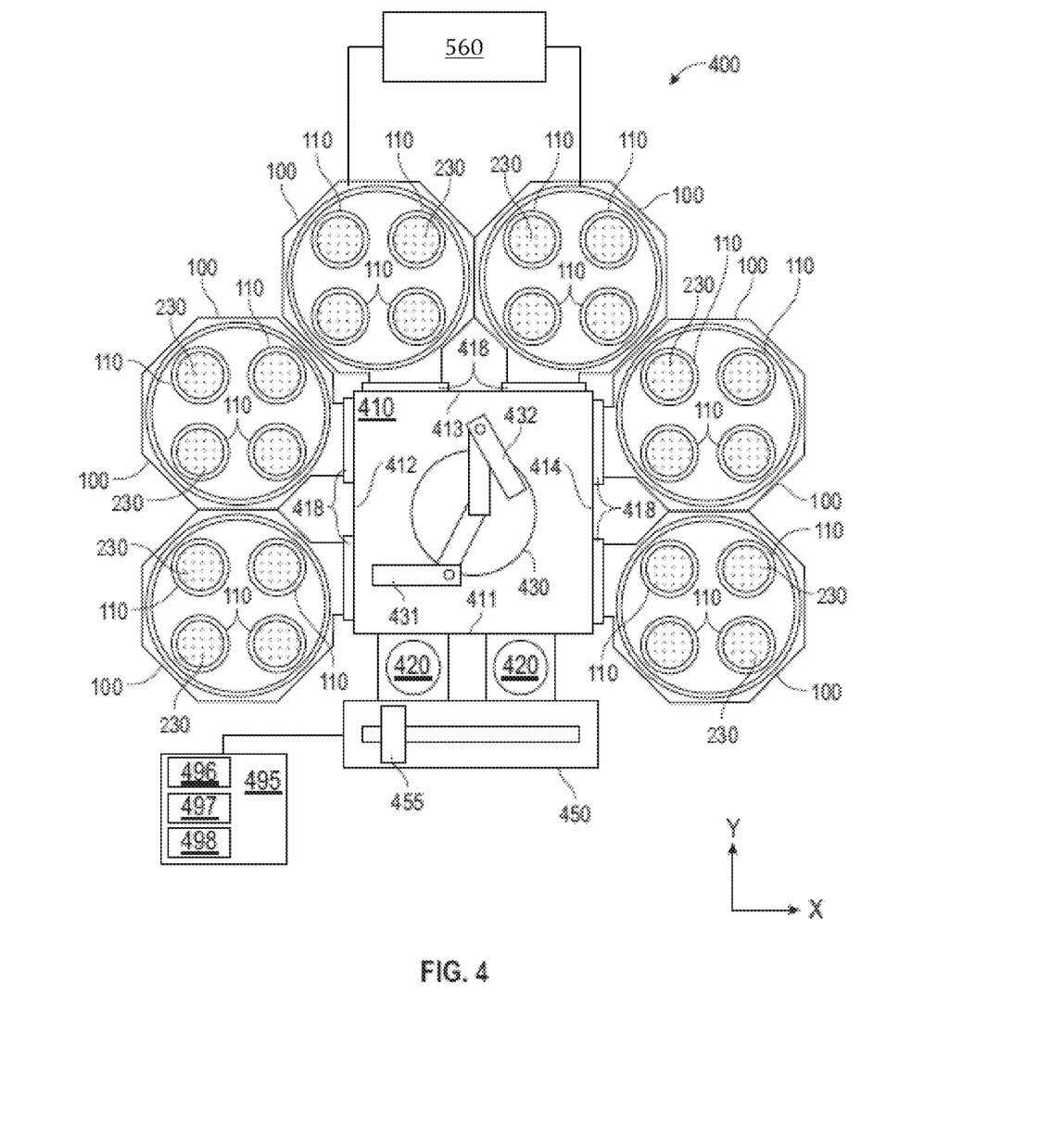
FIG. 4 is a schematic representation of a processing platform in accordance with one or more embodiment of the disclosure.

FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support 200 (FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

One or more embodiments of the disclosure provide valves to eliminate or reduce dead volume. In some embodiments, the valve enables alternate clean and process gas delivery in the chamber. Some embodiments of the disclosure do not require any purge to prevent back flow. Some embodiments eliminate side to side concentration difference in gas distribution plates due to purge gas flow from valve cleaning.

Some embodiments of the disclosure are directed to methods and apparatus for introducing gas into a substrate processing chamber. Dead volume can be eliminated using this valve. Some embodiments allow alternate clean and process gas delivery in the chamber. In some embodiments, the requirement of extra purge to exchange dead volume is eliminated.

One or more embodiment of the disclosure lower pressure upstream of the showerhead during movement in a spatial multi-wafer process tool to contain chemistry within the station and prevent cross-talk of residual gas species. Some embodiments minimize CVD type processes occurring in the ALD process. Some embodiments prevent residual chemistry cross-talk in a spatial tool. Some embodiments improve cycle time by eliminating the need for time-consuming purge and valve cleaning processes. Some embodiments improve film quality, resistivity, and/or conformality by creating a low pressure above wafer after dose.

Figure 5:
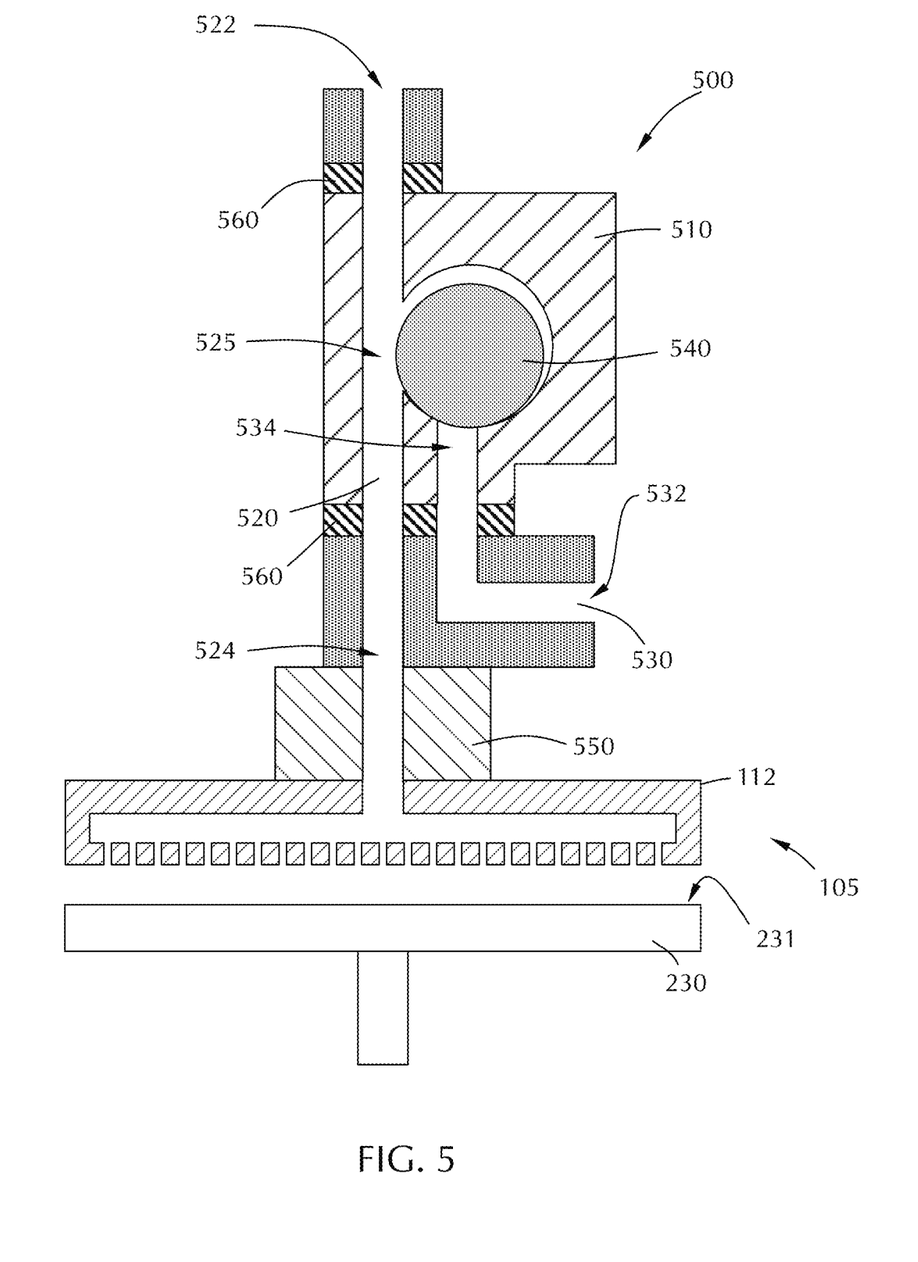
FIG. 5 is a schematic representation of a gas distribution apparatus with a dead volume-free valve according to one or more embodiment of the disclosure.

FIG. 5 illustrates a gas distribution apparatus 500 according to one or more embodiment of the disclosure. As will be understood by the skilled artisan, the gas distribution apparatus depicted can be incorporated in the processing chambers and process tools described with respect to FIGS. 1 through 4.

FIG. 5 illustrates a valve 510 in accordance with one or more embodiment of the disclosure. The valve 510 is also referred to as a dead volume-free valve. The valve 510 has a first inlet line 520 that passes through the body of the valve. The first inlet line has an upstream end 522 and a downstream end 524 that define the length of the first inlet line 520.

The valve 510 includes a second inlet line 530. The second inlet line 530 has an upstream end 532 and a downstream end 534 defining a length of the second inlet line 530. The shape of the inlet lines can be varied and the length is measured along a center line of the flow path of the lines.

The first inlet line 520 and the second inlet line 530 join at junction 525. The downstream end 534 of the second inlet line 530 connects with the first inlet line 520 at the junction 525. The junction of some embodiments is located along the length of the first inlet line 520. Stated differently, the junction 525 is located a distance from the upstream end 522 of the first inlet line 520 and a distance from the downstream end 524 of the first inlet line 520. The junction 525 can be located so that the distances from the first inlet end 522 and the first outlet end 524 are the same or different. In some embodiments, the junction 525 is located at about 50% of the length of the first inlet line 520. In some embodiments, the junction is in the range of 25% to 75% of the length of the first inlet line 520.

The valve 510 includes a sealing surface 540 positioned at the downstream end 534 of the second inlet line 530. The sealing surface 540 is configured to separate the first inlet line 520 and the second inlet line 530 to prevent fluid communication between the first inlet line 520 and the second inlet line 530 upstream of the sealing surface 540. Stated differently, in some embodiments, the second inlet line 530 has a valve 510 configured to allow a flow of gas downstream only. The sealing surface 540 can be made of any suitable material that is compatible with the chemistries to be flowed through the first inlet line 520 and the second inlet line 530. In some embodiments, the sealing surface 540 comprises a check valve.

Figure 5A:
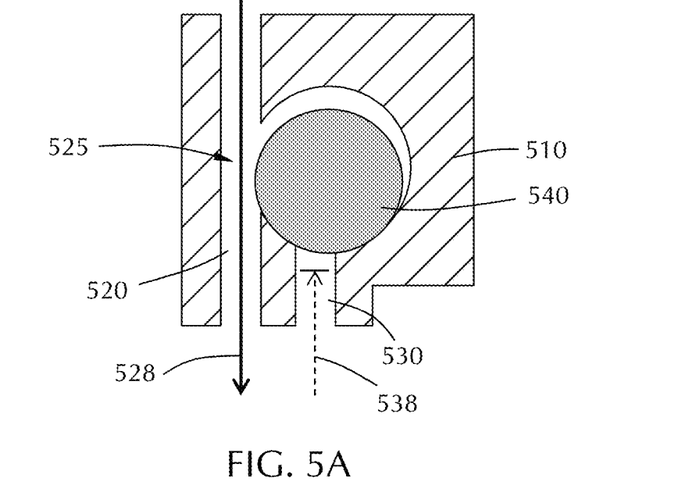
FIG. 5A is a schematic representation of a gas valve in the sealed position according to one or more embodiment of the disclosure.

In the illustrated embodiment, the valve 510 has a ball valve as a movable sealing surface 540. When insufficient flow passes through the second inlet line 530, the sealing surface is in the sealing position which covers the downstream end 534 of the second inlet line 530 so that no gases can backflow into the second inlet line 530 and no gases can leak from the second inlet line 530 into the first inlet line 520. The valve 510 with sealing surface 540 in the sealing position is shown in FIGS. 5 and 5A. As used in this manner, the term "sufficient flow differential" refers to the difference between the force exerted on the sealing surface 540 by the gas flow 528 in the first inlet line 520 and the force exerted on the sealing surface 540 by the gas flow 538 in the second inlet line 530. In some embodiments, a sufficient flow differential to move the sealing surface 540 to the sealing position means that the force exerted by the gas flow 528 in the first inlet line 520 is larger than the force exerted by gas flow 538 in the second inlet line 530 by a threshold value. The threshold value of some embodiments is a based, at least in part, on the force required to move the sealing surface 540 from sealing position to open position versus the force required to move the sealing surface 540 from the open position to the sealing position. For example, the threshold value of some embodiments varies where the force required to close or seal the valve 510 is less than the force required to open the valve to allow the gas flow 538 in the second inlet line 530 to flow past the sealing surface 540 is greater than the force to close, or vice versa.

Figure 5B:
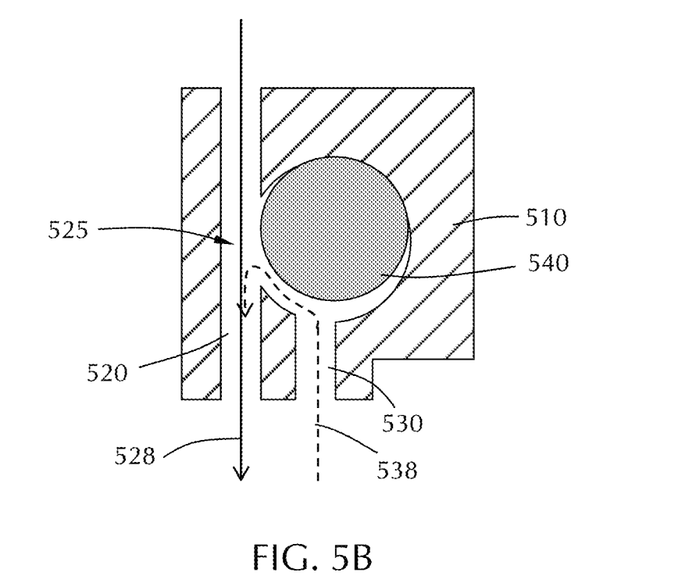
FIG. 5B is a schematic representation of a gas valve in the open position according to one or more embodiment of the disclosure.

FIG. 5B illustrates the valve 510 with the sealing surface 540 in the open position. When there is a sufficient flow differential between the first inlet line 520 and the second inlet line 530, the sealing surface 540 moves to allow fluid communication to occur from the downstream end 534 of the second inlet line 530 into the junction 525 and out the downstream end 524 of the first inlet line 520. In some embodiments, the movement of the sealing surface 540 between a sealing position (shown in FIG. 5A) and an open position (shown in FIG. 5B) causes any gases trapped within the valve 510 to be pushed out of the valve 510 into the first inlet line 520.

In some embodiments, the sealing surface 540 is configured to move to the open position when the force exerted by the flow in the second inlet line 530 is greater than a threshold value. The threshold value of some embodiments produces less force on the sealing surface 540 than the flow in the first inlet line 520 and moves the sealing surface 540 to the open position.

The sealing surface 540 of some embodiments allows movement of a fluid through the second inlet line 530 to enter the first inlet line 520 at junction 525. In some embodiments, the sealing surface 540 prevents fluid from the first inlet line 520 from entering the downstream end 534 of the second inlet line 530.

In some embodiments, the sealing surface 540 moves to an open position when gas is flowing through the second inlet line 530. In some embodiments, the gas flow and/or pressure in the second inlet line 530 exceeds a predetermined pressure and/or flow rate to move the sealing surface 540. In some embodiments, the sealing surface 540 moves to the closed position (shown in FIG. 5) when there is no gas flow in the second inlet line 530 or a pressure in the second inlet line 530 is below a predetermined threshold. In some embodiments, the threshold for opening/closing the sealing surface 540 is based on a differential pressure between the second inlet line 530 and the first inlet line 520. In some embodiments, the threshold to open the sealing surface is different than the threshold to close the sealing surface.

In some embodiments, there is no dead volume in the valve 510. Dead volume is space which a gas can form eddies and become stuck so that after flow is stopped some of that gaseous species remains and can be added to the next gas flow.

While two inlet lines are illustrated in FIG. 5, the skilled artisan will recognize that more than two inlet lines are within the scope of the disclosure. For example, the valve can have a third inlet line (not shown) connecting to the first inlet line 520 or the second inlet line 530 at a second junction (not shown). In some embodiments, the third inlet line connects to the first inlet line 520 at the same junction 525 as the second inlet line 530. In some embodiments, the third inlet line is configured as a purge line.

Some embodiments of the gas distribution apparatus 500 include a gas distribution assembly 105. The embodiment illustrated shows the gas distribution plate 112 as part of the apparatus 500. In some embodiments, the gas distribution plate 112 is in fluid communication with the second end 524 and the first inlet line 520. In some embodiments, the gas distribution plate 112 comprises a showerhead.

FIG. 5 illustrates an embodiment which includes an optional remote plasma source 550. The remote plasma source (RPS) 550 of some embodiments is positioned between the downstream end 524 of the first inlet line 520 and the gas distribution plate 112. The remote plasma source 550 can be any suitable plasma source known to the skilled artisan. Suitable sources include, but are not limited to, capacitively coupled plasma (CCP) sources, inductively coupled plasma (ICP) sources, microwave plasma sources.

In some embodiments, a gas manifold 560 (shown in FIG. 4) is between the downstream end 524 of the first inlet line 520 and the gas distribution plate 112. In some embodiments, the gas manifold splits the gas flow exiting the valve 510 to multiple process chambers or process stations. In some embodiments, a gas manifold 560 is between the downstream end 524 of the first inlet line 520 and the remote plasma source 550.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A gas distribution apparatus comprising:
   a valve having a first inlet line having an upstream end and a downstream end defining a length of the first inlet line;
   a second inlet line having an upstream end and a downstream end defining a length of the second inlet line, the downstream end of the second inlet line connecting with the first inlet line along the length of the first inlet line;
   a sealing surface at the downstream end of the second inlet line, the sealing surface configured to separate the first inlet line and the second inlet line to prevent fluid communication between the first inlet line and the second inlet line; and
   a spacer around a gas distribution plate, the spacer within an opening in a top of the processing chamber.

2. The gas distribution apparatus of claim 1, wherein the sealing surface allows movement of a fluid through the second inlet line to enter the first inlet line and prevent fluid from the first inlet line from entering the downstream end of the second inlet line.

3. The gas distribution apparatus of claim 1, wherein there is no dead volume in the valve.

4. The gas distribution apparatus of claim 1, further comprising a gas distribution plate in fluid communication with the second end of the first inlet line.

5. The gas distribution apparatus of claim 4, wherein the gas distribution plate comprises a showerhead.

6. The gas distribution apparatus of claim 5 further comprising a remote plasma source between the downstream end of the first inlet line and the gas distribution plate.

7. The gas distribution apparatus of claim 6, further comprising a gas manifold between the downstream end of the first inlet line and the remote plasma source.

8. The gas distribution apparatus of claim 1, wherein the sealing surface moves to an open position when gas flowing through the second inlet line exceeds a predetermined pressure.

9. The gas distribution apparatus of claim 8, wherein the sealing surface moves to a closed position when there is no gas flow in the second inlet line or a pressure in the second line is below a predetermined threshold.

10. A processing chamber comprising:
    a gas distribution apparatus having a valve, the valve comprising:
       a first inlet line having an upstream end and a downstream end defining a length of the first inlet line;
       a second inlet line having an upstream end and a downstream end defining a length of the second inlet line, the downstream end of the second inlet line connecting with the first inlet line along the length of the first inlet line; and
       a sealing surface at the downstream end of the second inlet line, the sealing surface configured to separate the first inlet line and the second inlet line to prevent fluid communication between the first inlet line and the second inlet line;
    a gas distribution plate in fluid communication with the second end of the first inlet line, the gas distribution plate having a front surface with a plurality of apertures therethrough to allow a flow of gas to pass through the gas distribution plate;
    a spacer around the gas distribution plate, the spacer within an opening in a top of the processing chamber; and
    a substrate support inside the processing chamber, the substrate support having a support surface spaced a distance from the front surface of the gas distribution plate.

11. The processing chamber of claim 10, wherein the sealing surface of the valve allows movement of a fluid through the second inlet line to enter the first inlet line and prevent fluid from the first inlet line from entering the downstream end of the second inlet line.

12. The processing chamber of claim 10, wherein there is no dead volume in the valve.

13. The processing chamber of claim 10, wherein the gas distribution plate comprises a showerhead.

14. The processing chamber of claim 10, further comprising a remote plasma source between the downstream end of the first inlet line and the gas distribution plate.

15. The processing chamber of claim 14, further comprising a gas manifold between the downstream end of the first inlet line and the remote plasma source.

16. The processing chamber of claim 10, wherein the sealing surface moves to an open position when gas flowing through the second inlet line exceeds a predetermined pressure.

17. The processing chamber of claim 16, wherein the sealing surface moves to a closed position when there is no gas flow in the second inlet line or a pressure in the second line is below a predetermined threshold.

* * * * *